US008812266B2

(12) United States Patent
Nakamura et al.

(10) Patent No.: US 8,812,266 B2
(45) Date of Patent: Aug. 19, 2014

(54) ABNORMALITY DETERMINATION SYSTEM AND ABNORMALITY DETERMINATION METHOD FOR PROCESSING APPARATUS

(75) Inventors: Naoto Nakamura, Koshi (JP); Toshihiko Nagano, Koshi (JP); Ryuji Asai, Koshi (JP); Seiji Kozawa, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 13/979,899

(22) PCT Filed: Jan. 17, 2012

(86) PCT No.: PCT/JP2012/050819
§ 371 (c)(1),
(2), (4) Date: Jul. 16, 2013

(87) PCT Pub. No.: WO2012/099106
PCT Pub. Date: Jul. 26, 2012

(65) Prior Publication Data
US 2013/0304419 A1 Nov. 14, 2013

(30) Foreign Application Priority Data

Jan. 18, 2011 (JP) ................................. 2011-007712

(51) Int. Cl.
*G06F 11/30* (2006.01)
*G06F 19/00* (2011.01)
*G06F 11/00* (2006.01)
(52) U.S. Cl.
USPC .............................. 702/183; 700/110; 714/25

(58) Field of Classification Search
USPC ............ 702/183, 81, 84, 127, 185, 189, 199; 700/28–29, 32–34, 109–110, 121; 703/2–4; 714/25, 47.1–47.2
See application file for complete search history.

(56) References Cited

U.S. PATENT DOCUMENTS

2006/0235560 A1* 10/2006 Ogawa et al. ................. 700/109
2007/0255991 A1 11/2007 Kaushal et al. ............... 714/733
2008/0147226 A1 6/2008 Matsushita et al. .......... 700/110

FOREIGN PATENT DOCUMENTS

| JP | 2000-243678 A1 | 9/2000 |
| JP | 2005-136102 A1 | 5/2005 |
| JP | 2007-273987 A1 | 10/2007 |
| JP | 2008-177534 A1 | 7/2008 |

OTHER PUBLICATIONS

International Search Report and Written Opinion dated Mar. 19, 2012.

* cited by examiner

*Primary Examiner* — Toan Le
(74) *Attorney, Agent, or Firm* — Burr & Brown, PLLC

(57) ABSTRACT

An abnormality determination system for a processing apparatus includes: a data acquiring section that acquires time-series data changing with time from a signal outputted by a sensor installed in a processing apparatus for processing a processing object; a data selecting section that selects only model data, which is useful time-series data, from the time-series data acquired by the data acquiring section; a threshold value setting section configured to calculate variable threshold value data changing with time from the model data selected by the data selecting section; and a determining section configured to determine an occurrence of an abnormality by comparing time-series data to be monitored, acquired by the data acquiring section, with the variable threshold value data. The selection of model data is performed based on an evaluation performed by an inspection device which is configured to evaluate a processing result of the processing object performed by the processing apparatus.

20 Claims, 12 Drawing Sheets

ABNORMALITY DETERMINATION SYSTEM AND ABNORMALITY DETERMINATION METHOD FOR PROCESSING APPARATUS

BACKGROUND OF THE INVENTION

1. Field of the Invention

The present invention relates to an abnormality determination system and an abnormality determination method for a processing apparatus.

2. Description of Related Art

In a semiconductor device manufacturing line, a photolithography technique is generally used to form a resist pattern in the surface of a substrate to be processed, such as a semiconductor wafer or an LCD substrate. The photolithography technique forms a predetermined resist pattern in the surface of the substrate by performing a sequence of process steps including: a resist coating step of applying a resist solution onto the surface of a substrate; an exposure step of exposing a pattern in the resist film formed; and a developing step of supplying a developer to the substrate after the exposure process. The sequential steps are performed in a resist coating/developing apparatus having various processing units for processing a substrate, a transport unit for transporting the substrate, etc.

In such a resist coating/developing apparatus, a plurality of substrates are transported and processed in a successive manner. Therefore, in the event of the occurrence of an abnormality in a processing unit of the apparatus, the abnormality should be detected promptly. If a substrate, which has undergone abnormal processing, is so subjected to later processing, a waste of a processing liquid, for example, will be produced. As an apparatus for determining the occurrence of an abnormality, a monitoring apparatus is known which includes a data acquiring section for acquiring data from sensors installed in various processing units, a data pickup section for picking up useful data from the data acquired by the data acquiring section, an abnormal data extracting section for extracting abnormal data from the useful data picked up by the data pickup section, and an abnormality determining section for correlating the abnormal data extracted by the abnormal data extracting section with failure information (see e.g. Japanese Patent Laid-Open Publication No. 2000-243678 (patent document 1)).

The abnormal data extracting section uses preset upper and lower constant threshold values when extracting abnormal data from the useful data picked up by the data pickup section. The abnormality determining section determines whether a change in data, which has been determined to be abnormal by the abnormal data extraction section, is related to failure information obtained in a later inspection step.

As described above, in the monitoring apparatus described in patent document 1, the abnormal data extraction section extracts and determines an abnormality based on the upper and lower constant threshold values. Accordingly, the monitoring apparatus cannot extract and determine the occurrence of an abnormality in processing, e.g. in the timing of processing, if the data value, corresponding to the abnormality, lies between the upper and lower constant threshold values. This leads to a lowering of the accuracy of abnormality determination.

SUMMARY OF THE INVENTION

The present invention provides an abnormality determination system and an abnormality determination method for a processing apparatus, which can enhance the accuracy of abnormality determination.

The abnormality determination system for a processing apparatus according to the present invention includes: a data acquiring section configured to acquire time-series data changing with time from a signal outputted by a sensor installed in a processing apparatus for processing a processing object; a data selecting section configured to select only model data, which is useful time-series data, from the time-series data acquired by the data acquiring section; a threshold value setting section configured to calculate variable threshold value data changing with time from the model data selected by the data selecting section; and a determining section configured to determine an occurrence of an abnormality by comparing time-series data to be monitored, acquired by the data acquiring section, with the variable threshold value data.

Preferably, the data acquiring section acquires time-series data for each unit of processing performed by the processing apparatus. The "unit of processing" herein may be a single process or a series of processes performed on a substrate during the period from transport of the substrate into a processing apparatus (processing unit) to transport of the substrate out of the processing apparatus (processing unit), or alternatively, may be one of a plurality of processes (e.g., a process using a first processing liquid and a process using a second processing liquid) performed on a substrate during the period from transport of the substrate into a processing apparatus (processing unit) to transport of the substrate out of the processing apparatus (processing unit).

The processing object may be subjected to a plurality of process steps in a plurality of processing sections constituting the processing apparatus, and the data acquiring section may acquire time-series data for each unit of processing performed by each of the processing sections from a signal outputted from a sensor installed in the processing section.

The threshold value setting section may calculate variable threshold value data at least in a certain chronological interval in the unit of processing.

Preferably, the data selecting section selects a number of model data; the abnormality determination system further comprises an average data calculating section for calculating average data from the model data; and the threshold value setting section calculates the variable threshold value data from the average data. Further, the threshold value setting section preferably calculates upper and lower variable threshold value data.

The threshold value setting section is preferably configured to allow change of an acceptable range of the variable threshold value data at least in a certain chronological interval.

The acceptable range of variable threshold value data herein refers to such a range that when the determining section compares time-series data to be monitored with the variable threshold value data, the determining section does not determine the time-series data to be abnormal if the data lies in the range.

In the invention, it is preferable that the upper threshold value of the variable threshold value data is calculated by adding a value, obtained by multiplying a standard deviation of model data values at a chronological point by a coefficient, to an average data value at the chronological point, while the lower threshold value of the variable threshold value data is calculated by subtracting the value, obtained by multiplying the standard deviation by the coefficient, from the average data value.

In the invention, it is more preferable that the upper threshold value of the variable threshold value data is calculated by adding a value, obtained by multiplying the standard deviation of model data values at a chronological point by a coefficient, to an average data value at the chronological point, and further adding, to a result of addition, a value obtained by multiplying the average data value by a correction value, while the lower threshold value of the variable threshold value data is calculated by subtracting the value, obtained by multiplying the standard deviation by the coefficient, from the average data value, and further subtracting, from a result of subtraction, the value obtained by multiplying the average data value by the correction value.

After processing of the processing object by means of the processing apparatus, the data selecting section may select the model data based on the results of evaluation by an inspection device that evaluates processing of the processing object performed by the processing apparatus.

An abnormality determination method according to the present invention includes: a data acquiring step that acquires time-series data changing with time from a signal outputted by a sensor installed in a processing apparatus for processing a processing object; a data selecting step that selects only model data, which is useful time-series data, from the time-series data acquired in the data acquiring step; a threshold value setting step that calculates variable threshold value data changing with time from the model data selected in the data selecting step; and a determining step that determines an occurrence of an abnormality by comparing time-series data to be monitored, acquired in the data acquiring step, with the variable threshold value data.

Preferably, the data acquiring step acquires time-series data for each unit of processing of the processing apparatus. The "unit of processing" herein may be a single process or a series of processes performed on a substrate during the period from transport of the substrate into a processing apparatus (processing unit) to transport of the substrate out of the processing apparatus (processing unit), or alternatively, may be one of a plurality of processes (e.g., a process using a first processing liquid and a process using a second processing liquid) performed on a substrate during the period from transport of the substrate into a processing apparatus (processing unit) to transport of the substrate out of the processing apparatus (processing unit).

The processing object may be subjected to a plurality of process steps in a plurality of processing sections constituting the processing apparatus, and the data acquiring step may acquire time-series data for each unit of processing performed by each of the processing sections from a signal outputted from a sensor installed in the processing section.

The threshold value setting step may calculate variable threshold value data at least in a certain chronological interval in the unit of processing.

Preferably, the data selecting step selects a number of model data; the abnormality determination method further comprises an average data calculation step of calculating average data from the model data; and the threshold value setting step calculates the variable threshold value data from the average data. Further, the threshold value setting step preferably calculates upper and lower variable threshold value data.

The threshold value setting step is preferably configured to allow change of the acceptable range of the variable threshold value data at least in a certain chronological interval.

The acceptable range of variable threshold value data herein refers to such a range that when the determining section compares time-series data to be monitored with the variable threshold value data, the determining section does not determine the time-series data to be abnormal if the data lies in the range.

Preferably, the upper threshold value of the variable threshold value data is calculated by adding a value, obtained by multiplying the standard deviation of model data values at a chronological point by a coefficient, to an average data value at the chronological point, while the lower threshold value of the variable threshold value data is calculated by subtracting the value, obtained by multiplying the standard deviation of model data values at the chronological point by the coefficient, from the average data value at the chronological point.

More preferably, the upper threshold value of the variable threshold value data is calculated by adding a value, obtained by multiplying the standard deviation of model data values at a chronological point by a coefficient, to an average data value at the chronological point, and further adding, to a result of addition, a value obtained by multiplying the average data value by a correction value, while the lower threshold value of the variable threshold value data is calculated by subtracting the value, obtained by multiplying the standard deviation by the coefficient, from the average data value, and further subtracting, from a result of subtraction, the value obtained by multiplying the average data value by the correction value.

After processing of the processing object by means of the processing apparatus, the data selecting step may select the model data based on the results of evaluation by an inspection device that evaluates processing of the processing object performed by the processing apparatus.

According to the abnormality determination system and the abnormality determination method of the present invention, model data, which is useful time-series data, is selected from the time-series data acquired from a signal outputted by a sensor installed in a processing so apparatus, and variable threshold value data is calculated from the model data. The occurrence of an abnormality in a change of time-series data to be monitored or in the timing of the change can be determined by comparing the time-series data with the calculated variable threshold value data. The abnormality determination system and method of the present invention can therefore enhance the accuracy of abnormality determination.

Since Variable threshold value data can be calculated based on the last acquired time-series data, the optimal variable threshold value data can therefore be promptly calculated even for processing as performed with a new recipe.

DETAILED DESCRIPTION OF THE INVENTION

Preferred embodiments of the present invention will now be described in detail with reference to the accompanying drawings.

The following description illustrates an abnormality determination system and method according to the present invention in the case where it is applied to a resist coating/developing apparatus for a wafer W as a processing object.

Figure 1:
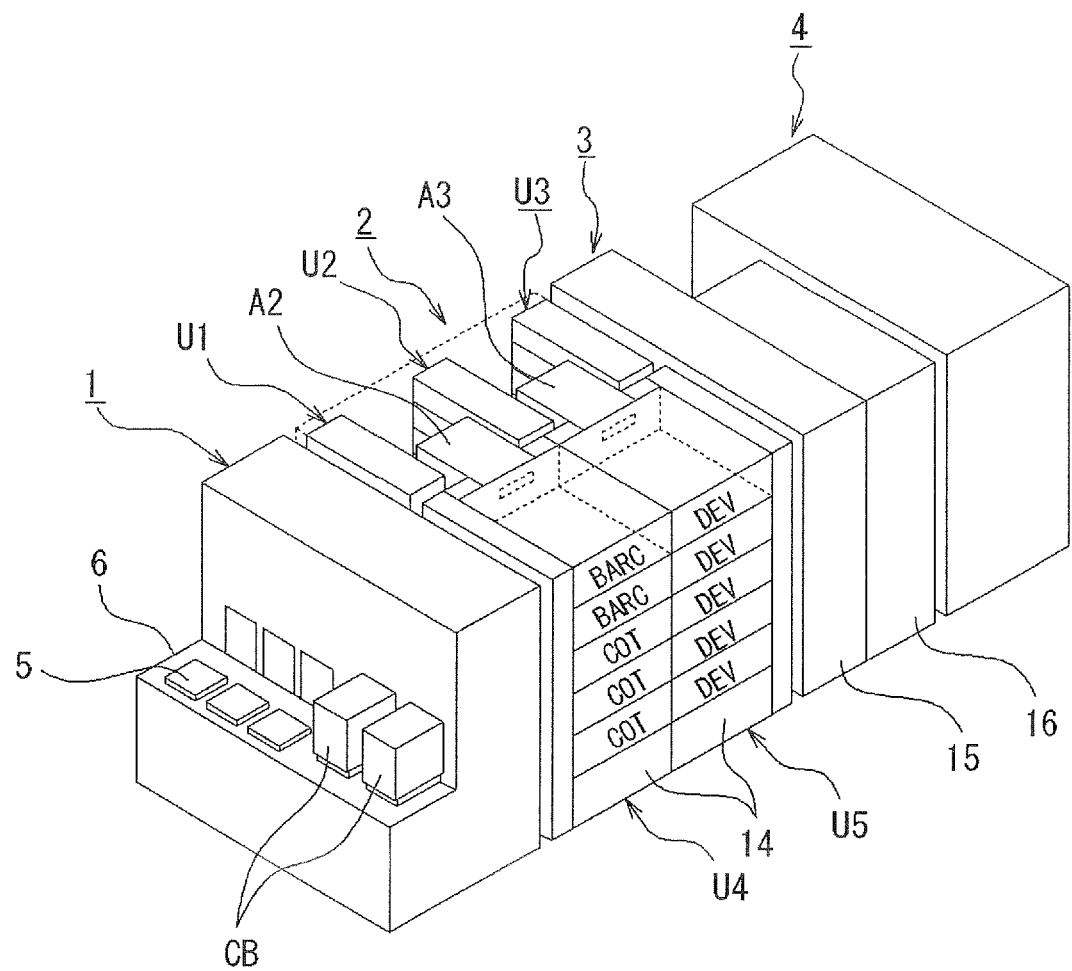
FIG. 1 is a schematic perspective view of a resist coating/developing apparatus to which an abnormality determination system according to the present invention is applied.
Figure 2:
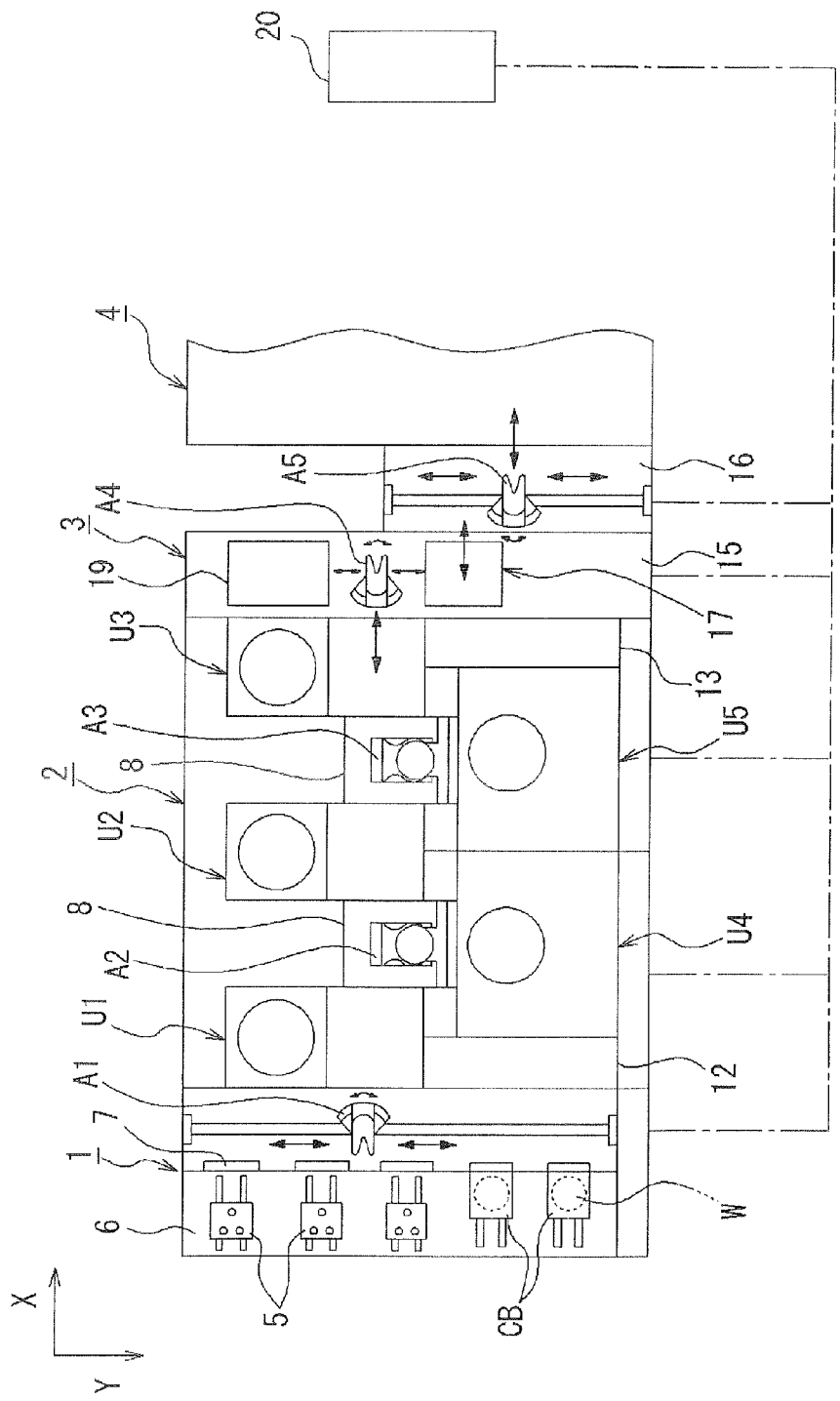
FIG. 2 is a schematic plan view of the resist coating/developing apparatus.

As shown in FIGS. 1 and 2, the resist coating/developing apparatus mainly comprises: a carrier block 1 for carrying in and out a cassette CB in which wafers W are housed; a processing block 2 for performing resist coating/developing processing of a wafer W that has been taken out of the cassette CB in the carrier block 1; and an exposure block 4 which communicates with the processing block 2 via an interface block 3.

The carrier block 1 includes a cassette station 6 provided with a plurality of stages 5 each for placing thereon a cassette CB in which one lot of, for example 25, wafers W are housed in a hermetically sealed condition, gates 7 mounted to a wall which is provided between the gates 7 and the cassette station 6, and a transfer means A1 for taking a wafer W out of each cassette CB through one of the gates 7.

The processing block 2 includes shelf units U1, U2, U3, each comprised of a vertical stack of heating/cooling units, and main transport mechanisms A2, A3 for transferring a wafer W between processing units including the below-described coating/developing units, the units U1 to U3 and the mechanisms A2, A3 being arranged alternately. In particular, the shelf units U1, U2, U3 and the main transport mechanisms A2, A3 are arranged in an anteroposterior line as viewed from the carrier block 1 and, in addition, each unit or mechanism, in a connecting area with an adjacent mechanism or unit, is provided with a not-shown opening for wafer transport, so that a wafer W can move freely in the processing block 2 from the shelf unit U1 at one end to the shelf unit U3 at the other end. The main transport mechanisms A2, A3 are each disposed in a space surrounded by a partition wall 8 consisting of side portions, each being part of one side wall of one of the shelf units U1, U2, U3 arranged in the anteroposterior direction as viewed from the carrier block 1, a right-hand front portion which is part of one side wall of one of the below-described liquid processing units U4, U5, and a left-hand rear portion. In FIG. 2, reference numerals 12 and 13 each indicate a temperature/humidity control unit including a temperature control device for a processing liquid used in each liquid processing unit, a duct for control of temperature and humidity, etc.

As shown in FIG. 1, the liquid processing units U4, U5 may each comprise a multi-stage, e.g. 5-stage, stack of coating units COT and antireflective coating-forming units BARC or of developing units DEV having a developing device, superimposed on a storage 14 that provides a space for supply of a chemical solution, such as a coating solution (resist solution) or a developer. The shelf units U1, U2, U3 are each comprised of a multi-stage, e.g. 10-stage, stack of various processing units each for performing pre-processing or post-processing for processing performed in the liquid processing unit U4 or U5. For example, the shelf units U1, U2, U3 may include a heating unit(s) for heating (baking) a wafer W, a cooling unit(s) for cooling a wafer W, an inspection device 37 for evaluating the processing state of a wafer W, etc.

The exposure block 4 is connected via the interface block 3 to the back side of the shelf unit U3 of the processing block 2. The interface block 3 consists of a transport chamber 15 and a transport chamber 16, disposed anteroposteriorly between the processing block 2 and the exposure block 4 and each defined e.g. by a chassis. In the center of the transport chamber 15 is provided a transport mechanism A4 which is movable in the X-axis, Y-axis and vertical (Z-axis) directions and is capable of rotating an arm on a vertical axis. The transport mechanism A4 is configured to be capable of approaching a transfer unit (TRS) 17, a high-precision temperature control unit (not shown), a peripheral exposure unit 19, a buffer cassette (not shown), and the shelf unit U3 of the processing block 2 in order to transfer/receive a wafer W to/from each of these units.

An exemplary flow of a wafer in the resist coating/developing apparatus having the above-described construction will now be described. First, a cassette CB in which wafers W are housed is carried into the apparatus and placed on one of the stages 5 of the carrier block 1. The gate 7 is opened, while the lid of the cassette CB is taken off and a wafer W is taken out by the transfer means A1. The wafer W is transferred to the main transport mechanisms A2 via a transfer unit (not shown), constituting one stage of the shelf unit U1, and then transferred to one shelf in the shelf units U1, U2, where the wafer W is subjected to pre-coating processing, such as hydrophobizing processing or cooling. Thereafter, the wafer W is transferred to a coating unit COT, where a resist solution is applied to the wafer W. Next, the wafer W is heated (baked) in a heating unit, constituting one shelf in the shelf units U1 to U3, and is then cooled. Thereafter, the wafer W is transported into the interface block 3 via a transfer unit in the shelf unit U3. In the interface block 3, the wafer W is transported by the transport mechanism A4 into the peripheral exposure unit 19 in the transport chamber 15, where the wafer W is subjected to peripheral exposure processing. The wafer W after the peripheral exposure processing is transported by the transport mechanism A4 to the high-precision temperature control unit, where the temperature of the surface of the wafer W is precisely adjusted to a set temperature corresponding to the internal temperature of the exposure block 4. The transport mechanism A4 transfers the temperature-adjusted wafer W, via the transfer unit 17, to a transport mechanism A5 disposed in the transport chamber 16. The wafer W is transported by the transport mechanism A5 to the exposure block 4, where the wafer W is subjected to exposure processing. Thereafter, the wafer W is transported along the opposite route to the main transport mechanisms A3 and transferred to a developing unit DEV, where the wafer W is processed with a developer to remove an unnecessary resist. Thereafter, the wafer W is subjected to heating (post-baking) in a heating unit constituting one shelf in the shelf units U1 to U3, followed by cooling in a cooling unit. Thereafter, the wafer W is transported to the inspection device 37 for evaluation of the surface processing state. The wafer W is then returned to the cassette CB on the stage 5 in the carrier block 1.

Figure 3:
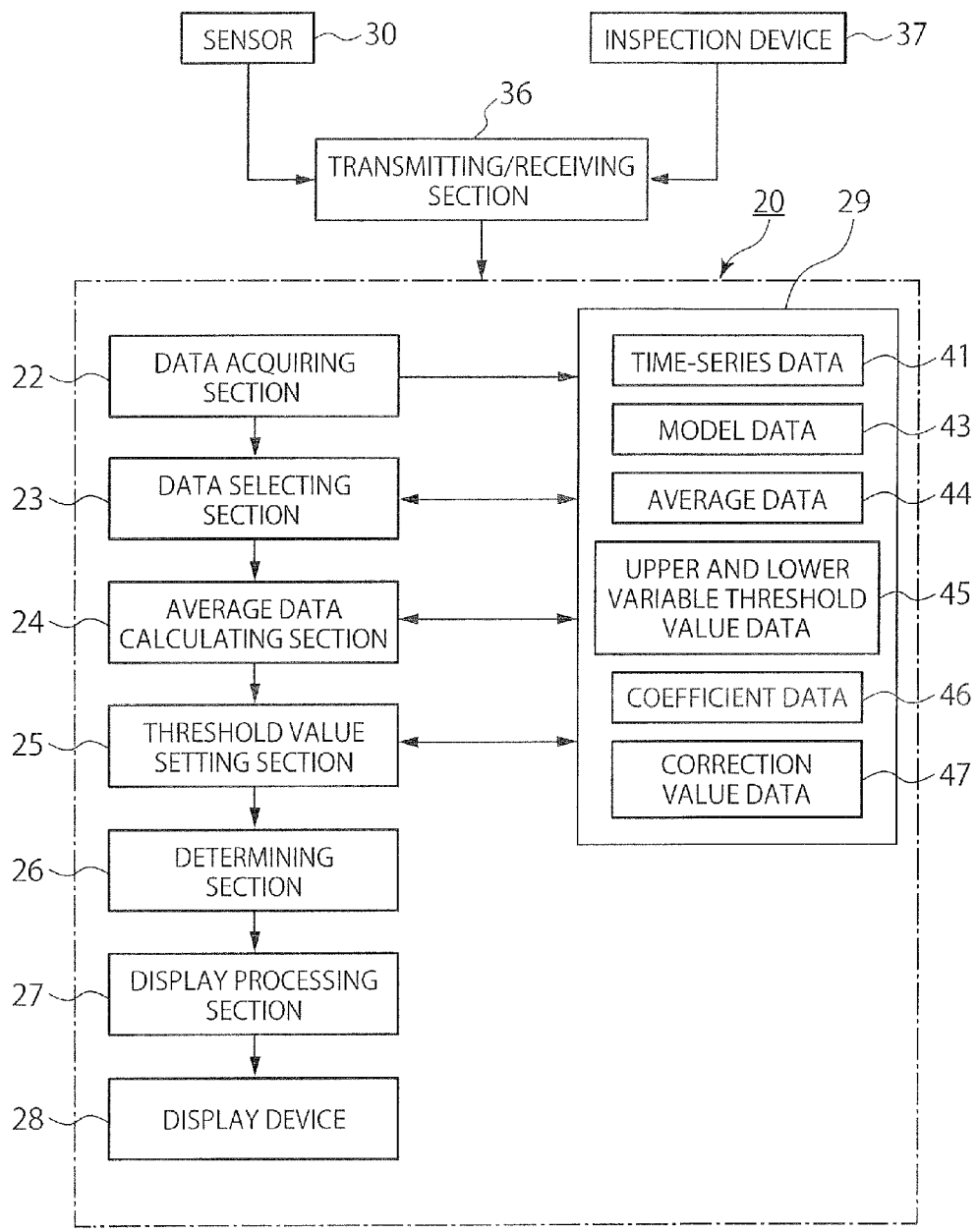
FIG. 3 is a block diagram illustrating the logical configuration of an abnormality determination system according to the present invention.
Figure 4:
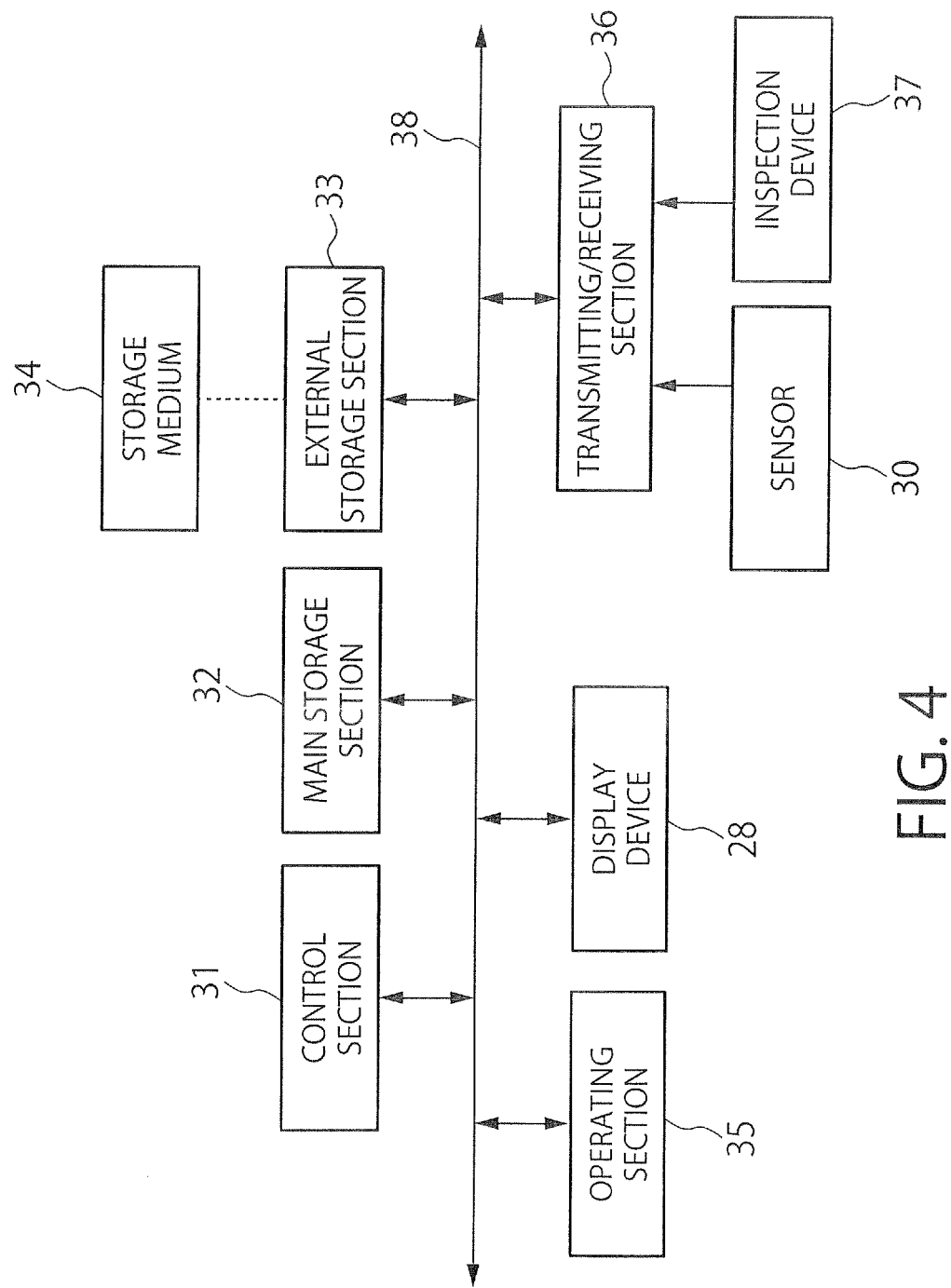
FIG. 4 is a block diagram illustrating the schematic construction of an abnormality determination system according to the present invention.

An abnormality determination system 20 according to the present invention will now be described. The abnormality determination system 20 determines whether an abnormality has occurred in the resist coating/developing apparatus. As shown in FIGS. 2 through 4, the abnormality determination system 20 is connected by wiring and via a transmitting/receiving section 36 to a sensor 30 installed in each of the processing sections (processing units) constituting the resist coating/developing apparatus. Each sensor 30 outputs a signal, which makes time-series data 41 that changes with time, to the abnormality determination system 20 and may, for example, be a pressure sensor, a temperature sensor, a flow rate sensor, a liquid level sensor, a position sensor, a torque sensor, or a speed sensor. A plurality of the same or different sensors 30 may be provided in one processing section.

As shown in FIGS. 3 and 4, the abnormality determination system 20 receives a signal from a not-shown output section of the inspection device 37 via the transmitting/receiving section 36. The inspection device 37 is to detect a macro defect on a wafer W so as to evaluate the processing state of the wafer W, and can evaluate whether the processing state of the wafer W is normal or abnormal after the sequence of process steps for the wafer W, performed by the resist coating/developing apparatus, is completed and before the wafer W is returned to the cassette CB. The evaluation results are outputted to the abnormality determination system 20.

As shown in FIG. 3, the logical configuration of the abnormality determination system 20 comprises a data acquiring section 22, a data selecting section 23, an average data calculating section 24, a threshold value setting section 25, a determining section 26, a display processing section 27, a display device 28, a data holding section 29, etc. The data holding section 29 stores time-series data 41, model data 43, average data 44, upper and lower variable threshold value data 45, coefficient data 46 and correction value data 47.

The data acquiring section 22 acquires time-series data 41 that changes with time from signals outputted by a sensor 30 installed in each processing section, and stores the time-series data 41 in the data holding section 29. The time-series data 41 may be, for example, data on pressure, temperature, flow rate, liquid level, position, torque or speed that changes with time.

The data selecting section 23 selects model data 43, which is useful data of the time-series data 41, from the time-series data 41 acquired by the data acquiring section 22, and stores the model data 43 in the data holding section 29. The data selecting section 23 can select a plurality of model data 43. After processing of wafers W in the resist coating/developing apparatus, the data selecting section 23 can select model data 43 based on the results of evaluation by the inspection device 37 that evaluates processing of each wafer performed by the resist coating/developing apparatus. Thus, the time-series data 41 on a wafer W, whose processing state has been evaluated as abnormal by the inspection device 37, is not selected as model data 43.

The inspection device 37 may make a lot-based evaluation of processing by evaluating a lot, not containing a wafer W whose processing state has been evaluated as abnormal, as a normal lot and evaluating a lot, containing a wafer(s) W whose processing state has been evaluated as abnormal, as an abnormal lot. The data selecting section 23 may select all the time-series data 41 on a normal lot as model data 43.

As described above, after processing of wafers W in the resist coating/developing apparatus, the data selecting section 23 selects model data 43 based on the results of evaluation by the inspection device 37 that evaluates processing of each wafer W performed by the resist coating/developing apparatus, whereby the time-series data 41 on wafers W which have been normally processed in the resist coating/developing apparatus are used. This makes it possible to immediately respond to a new recipe and, in addition, eliminate the need to consider a numerical difference between the devices produced due to individual difference of the devices.

The average data calculating section 24 calculates average data 44 from the model data 43, and stores the average data 44 in the data holding section 29.

The threshold value setting section 25 calculates upper and lower variable threshold value data 45 that changes with time from the average data 44, calculated by the average data calculating section 24, and from pre-inputted coefficient data 46 and correction value data 47. The upper and lower variable threshold value data 45 refers to data on upper and lower variable threshold values. A method for calculating the upper and lower variable threshold value data 45 will be described later.

The determining section 26 compares time-series data 41 to be monitored, acquired by the data acquiring section 22, with the upper and lower variable threshold value data 45 and, when the time-series data 41 to be monitored falls outside the threshold range, determines that an abnormality has occurred. The time-series data 41 to be monitored herein refers to time-series data 41 which is acquired after the acquisition of that time-series data 41 which was used to calculate the upper and lower variable threshold value data 45, e.g. to time-series data 41 which, after the acquisition of time-series data 41 on one lot of wafers W, is acquired in processing of a wafer(s) W of the next lot.

The display processing section 27 displays, on the display device 28, e.g. the results of abnormality determination for each processing section. The display processing section 27 may additionally display the time-series data 41, the upper and lower variable threshold value data 45, etc. in a graphical form on the display device 28. In the event of determination of an abnormality, the display processing section 27 may display a flashing alarm message on the display device 28 or sound an alarm.

As shown in FIG. 4, the abnormality determination system 20 comprises a control section 31, a main storage section 32, an external storage section 33, a storage medium 34, an operating section 35, the display device 28 and the transmitting/receiving section 36. The control section 31, the main storage section 32, the external storage section 33, the operating section 35, the display device 28 and the transmitting/receiving section 36 are all connected to the control section 31 via an internal bus 38.

The control section 31 is comprised of a microprocessor such as CPU, and executes processing of the data acquiring section 22, the data selecting section 23, the average data calculating section 24, the threshold value setting section 25, the determining section 26 and the display processing section 27 according to a program or a recipe, e.g. containing data on processing conditions, stored in the external storage section 33. The data acquiring section 22, the data selecting section 23, the average data calculating section 24, the threshold value setting section 25, the determining section 26 and the display processing section 27 are implemented by the control section 31 and a program which is executed on the control section 31.

The main storage section 32 is comprised of e.g. RAM, and is used as an operating area for the control section 31. The data holding section 29 is stored and held as a storage area structure in part of the main storage section 32.

The external storage section 33 is comprised of a hard disk, a flash memory, or the like, and pre-stores a program or a recipe, e.g. containing data on processing conditions, for causing the control section 31 to execute the above-described processing and, following the instructions of the control section 31, supplies data of the program to the control section 31 and stores data supplied from the control section 31.

The storage medium 34 is a computer-readable storage medium which stores a program that operates on a computer. A program or a recipe, e.g. containing data on processing conditions, for causing the control section 31 to execute the above-described processing is stored in the storage medium 34. The program or recipe can be installed on and pre-stored in the external storage section 33. A DVD, a CD-ROM, a flexible disk, or the like can be used as the storage medium 34.

In order for the operator to give instructions to the abnormality determination system 20, the operating section 35 includes devices such as a keyboard and a mouse, and an interface for connecting the devices to the internal bus 38. Instructions on selection of a recipe, the start of abnormality determination, etc. are inputted through the operating section 35 and supplied to the control section 31. The operator can also input e.g. coefficient data 46 or correction value data 47 from the operating section 35 for setting or a change of data.

The display device 28 is comprised of a display such as a CRT or LCD, and displays time-series data 41 in a graphical form, the results of abnormality determination, etc. according to the instructions of the control section 31. The display device 28 may be provided with an output device, such as a speaker, for sounding an alarm according to the instructions of the control section 31.

The transmitting/receiving section 36 has an interface function capable of connecting to wiring which is connected to a sensor 30 installed in each processing section, and to wiring which is connected to a not-shown output section of the inspection device 37. The control section 31 receives time-series data 41 from each sensor 30 via the transmitting/receiving section 36. In some cases, time-series data is stored at another not-shown server. In that case, the control section 31 receives the time-series data 41 from the server via the transmitting/receiving section 36.

A method for calculating upper and lower variable threshold value data 45 by means of the threshold value setting section 25 will now be described. The data calculation method can be expressed by the following formula (1):

$$M = N \pm k \times \sigma \pm N \times H \quad (1)$$

where the symbols represent the following:
M: upper and lower variable threshold value data value
N: average data value at a chronological point
k: coefficient
σ: standard deviation of model data values at the chronological point
H: correction value The coefficient k and the correction value H are arbitrary numerical values that the operator can set through the operating section 35. The acceptable range of upper and lower variable threshold value data 45 can be changed at least in a certain chronological interval (time period) by changing the numerical values of the coefficient k and the correction value H. The acceptable range of upper and lower variable threshold value data 45 herein refers to such a range that when the determining section 26 compares time-series data 41 to be monitored with the upper and lower variable threshold value data 45, the determining section 26 does not determine the time-series data 41 to be abnormal if the data 41 lies in the range.

If the acceptable range of upper and lower variable threshold value data 45 is intended to be set broad in a certain chronological interval in a unit of processing, then a large numerical value will be used for the coefficient k. On the other hand, the calculation of upper and lower variable threshold value data 45 involves addition or subtraction of σ, i.e. the standard deviation of model data values, multiplied by the coefficient k. Therefore, when the standard deviation σ is small because of small variation in the model data values, the acceptable range of upper and lower variable threshold value data 45 can be too narrow. In view of this, the upper threshold value of upper and lower variable threshold value data 45 is calculated by adding a value obtained by multiplying σ, i.e. the standard deviation of model data values at a chronological point, by the coefficient k to the average data value N at the chronological point, and adding, to the resulting value, a value obtained by multiplying the average data value N by the correction value H. On the other hand, the lower threshold value of upper and lower variable threshold value data 45 is calculated by subtracting the value obtained by multiplying σ, i.e. the standard deviation of model data values at the chronological point, by the coefficient k from the average data value N at the chronological point, and subtracting, from the resulting value, the value obtained by multiplying the average data value N by the correction value H. Such a calculation can provide an appropriate acceptable range of upper and lower variable threshold value data 45.

Figure 5:
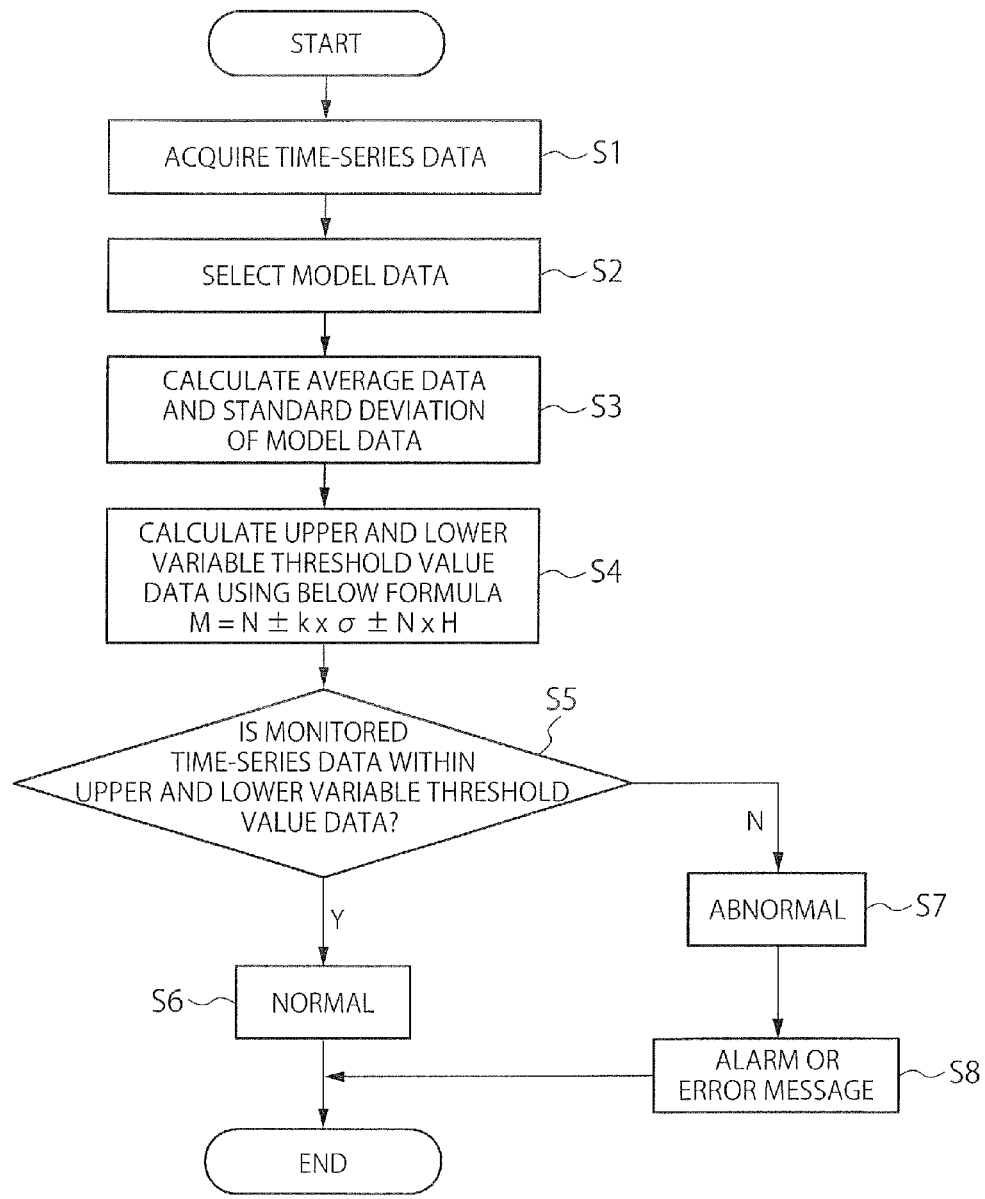
FIG. 5 is a flow chart illustrating a process of an abnormality determination method according to the present invention.
Figure 6:
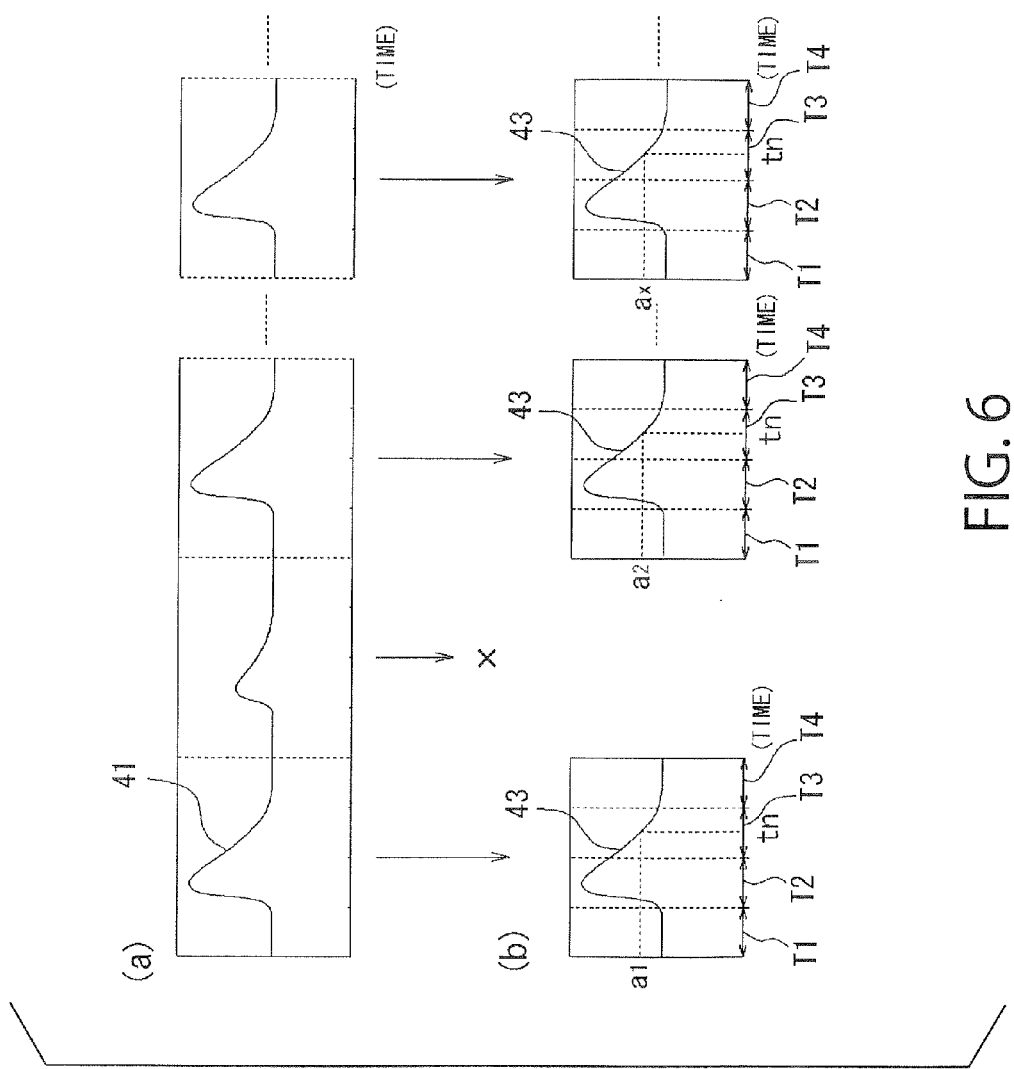
FIG. 6($a$) is a graph showing exemplary time-series data, and FIG. 6($b$) is a graph showing exemplary model data.

A method for determining an abnormality by means of the abnormality determination system 20 will now be described with reference to FIGS. 5 through 8. FIG. 5 is a flow chart showing a process of an abnormality determination method, which proceeds as shown by the arrows. First, time-series data 41 that changes with time is acquired from a signal outputted by a sensor 30 installed in each processing section in the resist coating/developing apparatus (step S1). As shown in FIG. 6(*a*), the step S1 includes the step of acquiring (dividing) time-series data 41 in each unit of processing from the signal. The unit of processing herein refers to, for example, a cycle from transport of a wafer W into a processing device to transport of the wafer W out of the processing device, or a cycle from the stoppage of supply of a processing liquid to the next stoppage of supply.

Next, model data 43, which is useful time-series data 41, is selected from the time-series data 41 acquired in step S1 (step S2). In the selection of model data 43, the time-series data 41 on a wafer W, whose processing state has been evaluated as abnormal by the inspection device 37, is not selected as model data 43. For example, as shown in FIGS. 6(*a*) and 6(*b*), the time-series data 41 on the second processing is not selected as model data 43 because the processing state of the wafer W has been evaluated as abnormal by the inspection device 37.

Figure 7:
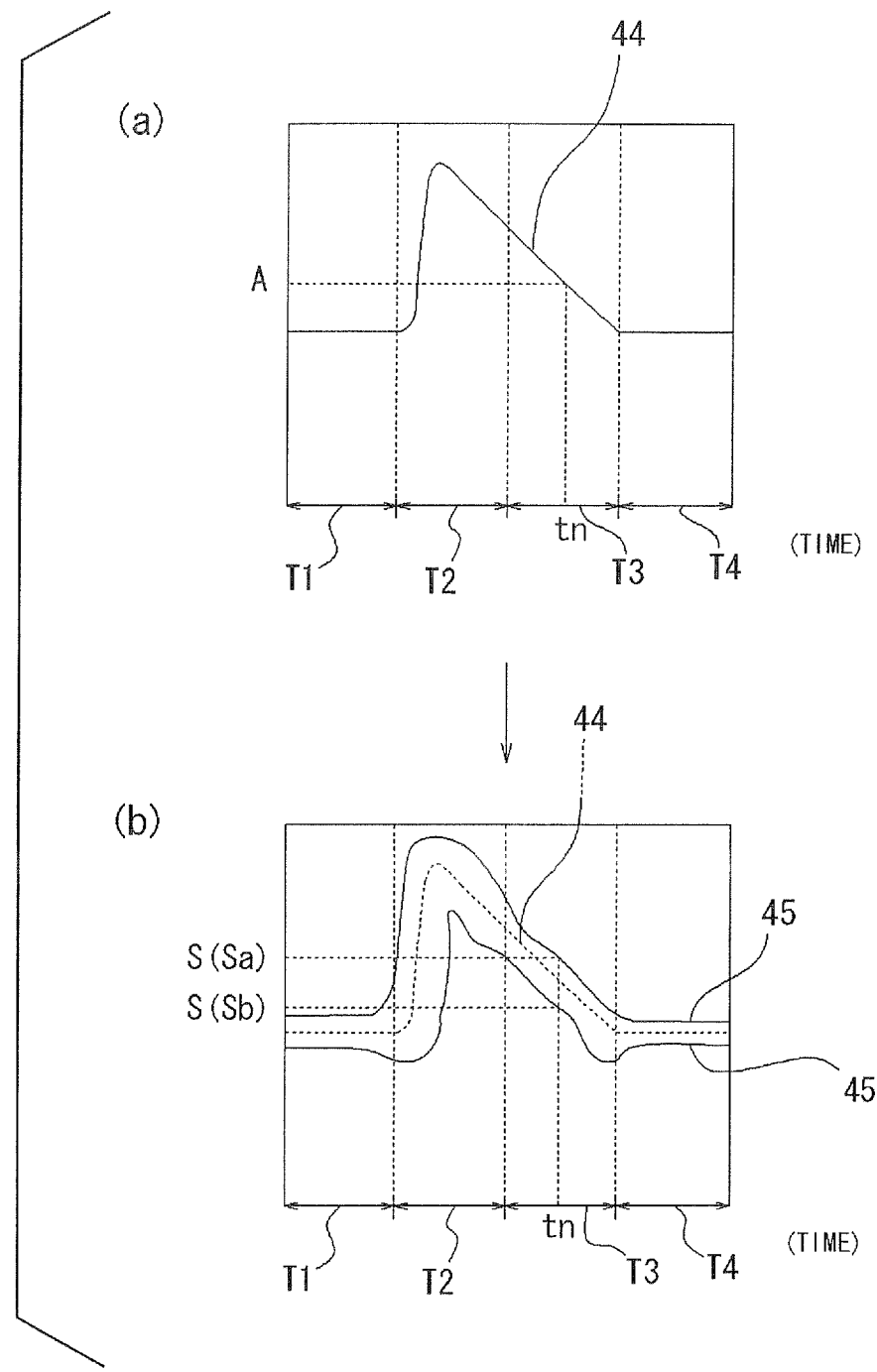
FIG. 7($a$) is a graph showing exemplary average data, and FIG. 7($b$) is a graph showing exemplary upper and lower variable threshold value data.

Next, the average data 44 and the standard deviation are calculated (step S3) from the selected model data 43. FIG. 7(*a*) shows the calculated average data 44 in a graphical form.

Next, upper and lower variable threshold value data 45 is calculated by the above formula (1) (step S4). As shown in FIG. 7(*b*), at any chronological point tn, the value(s) S of the upper and lower variable threshold value data 45 can be expressed by the following formula (2) derived from the above formula (1):

$$S = A \pm k \times \sigma \pm A \times H \quad (2)$$

where the symbols represent the following:
S: value(s) of upper and lower variable threshold value data 45 at a chronological point tn (see FIG. 7(*b*). In the Figure, Sa represents the upper threshold value of the variable threshold value data, and Sb represents the lower threshold value of the variable threshold value data)

A: value of average data 44 at the chronological point tn (see FIG. 7(*a*))

k: coefficient

σ: standard deviation of values (a1, a2 ... ax) of model data 43 at the chronological point tn (see FIG. 6(*b*))

H: correction value

The upper threshold value Sa of the upper and lower variable threshold value data and the lower threshold value Sb of the upper and lower variable threshold value data may also be calculated by the following formulae:

$$Sa = Ma + (Ma - Mi) \times k' \quad (3)$$

$$Sb = Mi - (Ma - Mi) \times k' \quad (4)$$

where the symbols represent the following:

Ma: maximum value of model data 43 at the chronological point tn

Mi: maximum value of model data 43 at the chronological point tn

K': coefficient

FIG. 7(*b*) shows the calculated upper and lower variable threshold value data 45 in a graphical form. In FIG. 7(*b*), the dotted line represents the average data 44, and the solid lines represent the upper and lower variable threshold value data 45.

Figure 8:
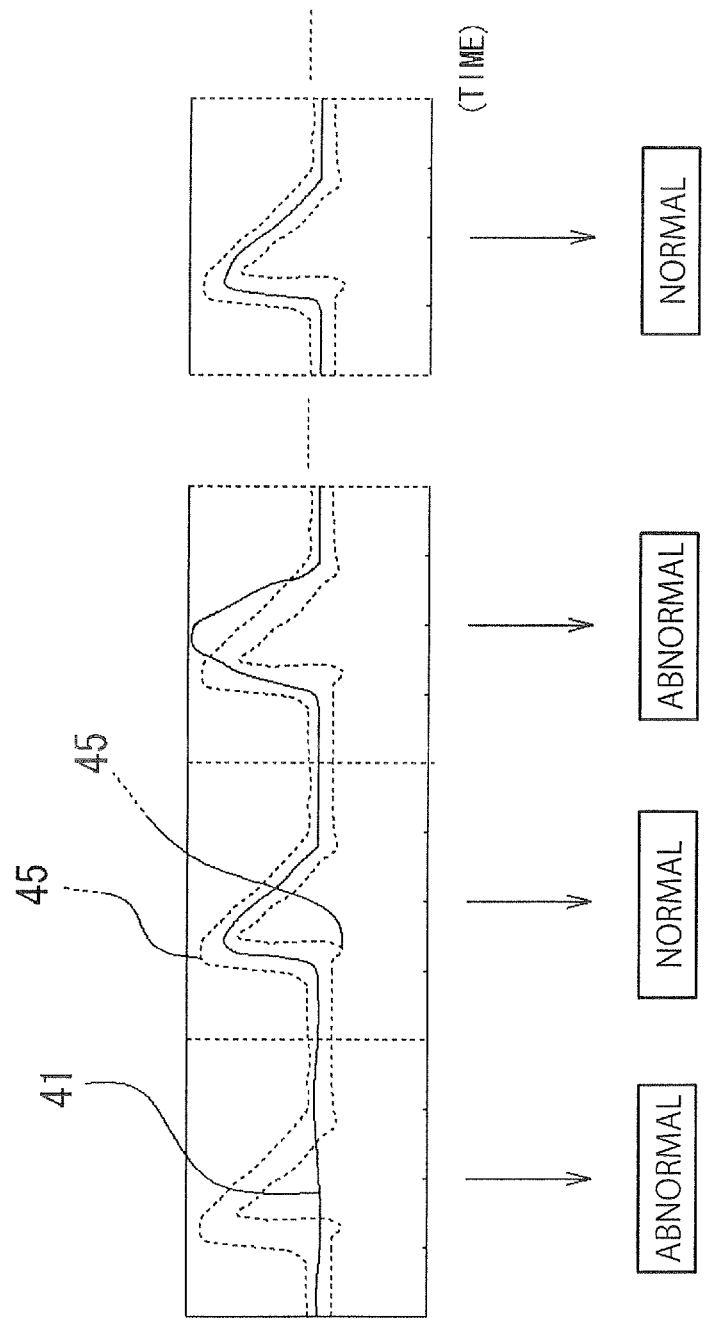
FIG. 8 is a graph illustrating comparison of upper and lower variable threshold value data with time-series data to be monitored.

Next, the occurrence of an abnormality is determined by comparing time-series data 41 to be monitored with the upper and lower variable threshold value data 45 calculated in step S4 (step S5). FIG. 8 illustrates comparison of the time-series data 41 to be monitored with the upper and lower variable threshold value data 45. In FIG. 8, the solid line represents the time-series data 41 to be monitored, and the dotted lines represent the upper and lower variable threshold value data 45.

In step S5, the time-series data 41 is determined to be normal if it is determined to lie within the range of the upper and lower variable threshold value data 45 (step S6). Thus, as shown in FIG. 8, the second processed wafer W and the Xth processed wafer W are determined to have been normally processed. In contrast, the time-series data 41 is determined to be abnormal if it is determined to lie outside the range of the upper and lower variable threshold value data 45 (step S7). Thus, as shown in FIG. 8, the first processed wafer W and the third processed wafer W are determined to have been abnormally processed. In this case, a flashing error message may be displayed on the display device 28, or an alarm may be sounded (step S8).

Because upper and lower variable threshold value data 45 can thus be calculated based on the time-series data 41 acquired, the optimal upper and lower variable threshold value data 45 can be promptly calculated even for processing as performed with a new recipe. The upper and lower variable threshold value data 45 can be updated by calculating the latest data 45 from the last acquired time-series data 41. In performing the updating, the last acquired time-series data 41 may be added to the model data 43 from which the upper and lower variable threshold value data 45 was calculated. Thus, the average data 44 is calculated from the increased population. This can enhance the accuracy of the average data 44, making it possible to precisely calculate the latest upper and lower variable threshold value data 45.

According to the abnormality determination system and the abnormality determination method of this embodiment, model data 43, which is useful data of time-series data 41, is selected from the time-series data 41 acquired from a signal outputted by a sensor 30 installed in the processing apparatus (processing section), and upper and lower variable threshold value data 45 is calculated from the model data 43. The occurrence of an abnormality in a change of monitored time-series data 41 or in the timing of the change can be determined by comparing the time-series data 41 with the calculated upper and lower variable threshold value data 45. The abnormality determination system and method of this embodiment can therefore enhance the accuracy of abnormality determination.

Further, the calculation of upper and lower variable threshold value data 45 involves adding or subtracting the value, obtained by multiplying the standard deviation of model data values at a chronological point by the coefficient k, to or from the average data value at the chronological point. This can enhance the accuracy of the upper and lower variable threshold value data 45, thereby further enhancing the accuracy of abnormality determination.

The calculation of the upper and lower variable threshold value data 45 further involves adding or subtracting the value obtained by multiplying the average data value by the correction value H. This can further enhance the accuracy of the upper and lower variable threshold value data 45, thereby further enhancing the accuracy of abnormality determination.

Furthermore, after processing of a wafer W in the processing apparatus, the processing state of the wafer W is evaluated in the inspection device 37, and model data 43 is selected based on the evaluation results. This makes it possible to calculate the upper and lower variable threshold value data 45 by solely using model data 43 on wafers W which have been processed normally, thereby further enhancing the accuracy of abnormality determination.

Though upper and lower variable threshold value data 45 is calculated and set for all the chronological intervals (T1, T2, T3, T4) in the above-described abnormality determination method, it is also possible to calculate upper and lower variable threshold value data 45 only for part of the chronological intervals, e.g. for T2 and T3. As shown by the average data 44 in FIG. 7(*a*), the value of the monitoring object of a sensor 30 in one unit of processing tends to remain constant during the chronological interval T1, increase at a large inclination angle initially in the interval T2, and subsequently decrease at a small inclination angle until the end of the interval T3, and finally remain constant during the interval T4. The upper and lower variable threshold value data 45 may be calculated and set only for the intervals 12 and T3, and compared with time-series data 41 to be monitored in the intervals T2 and T3. Even this method can monitor the chronological intervals T2 and T3 where time-series data 41 changes significantly. Thus, even this abnormality determination method can determine the occurrence of an abnormality in the change of time-series data 41 to be monitored or in the timing of the change, thereby enhancing the accuracy of abnormality determination.

Further, different coefficients k and different correction values H may be set for the chronological intervals T1, T2, T3, and T4.

A description will now be given of application of the above-described abnormality determination system 20 to a heat treatment device 70 which is one of the processing sections constituting the resist coating/developing apparatus. The heat treatment device 70 is disposed in a heating unit provided e.g. in the shelf unit U2, and is configured to heat (bake) a wafer W to which a resist solution has been applied in one of the coating units COT.

Figure 9:
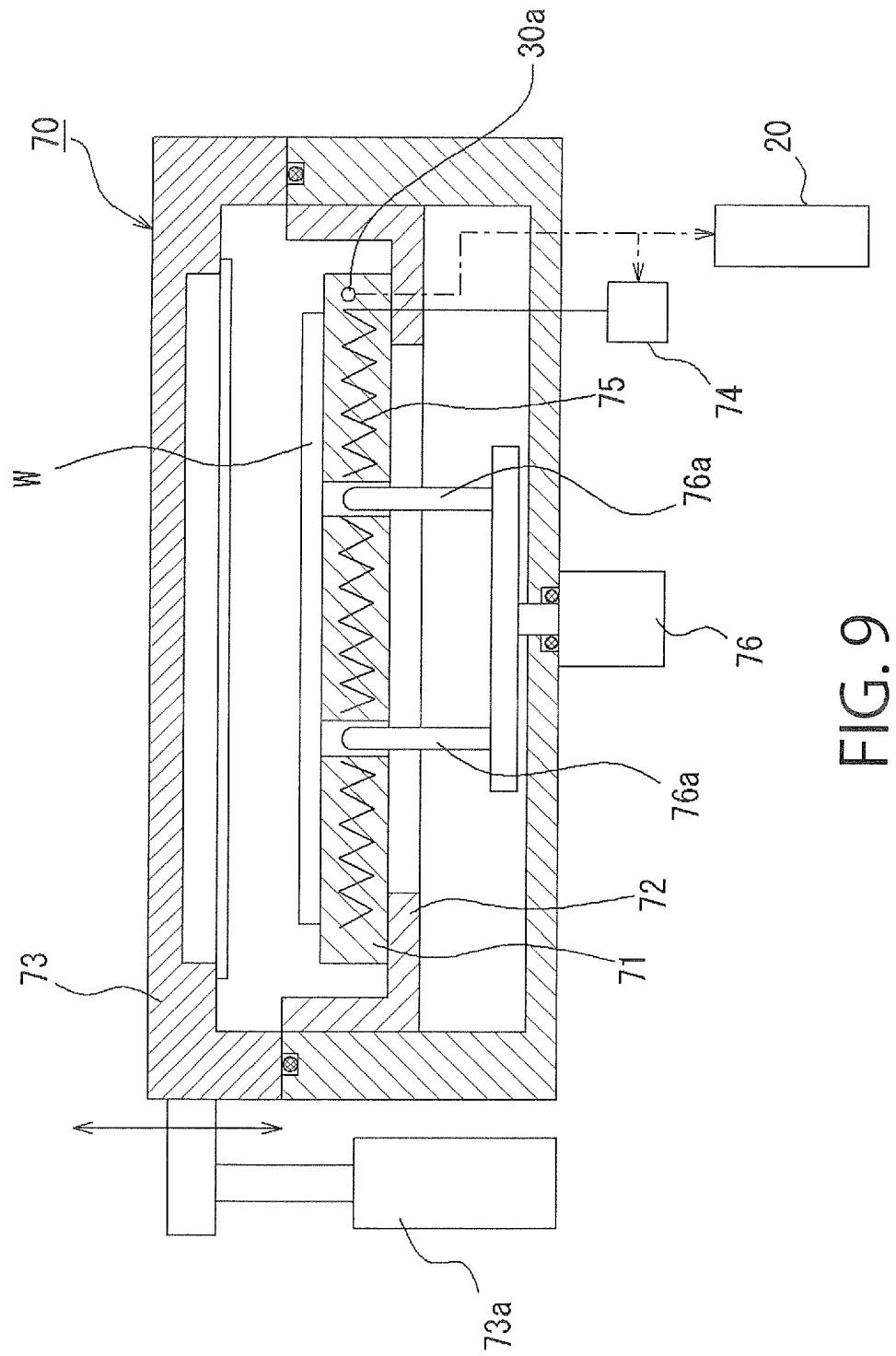
FIG. 9 is a cross-sectional view showing the schematic construction of a heating unit, constituting the resist coating/developing apparatus, and the abnormality determination system.

As shown in FIG. 9, the heat treatment device 70 mainly comprises a hot plate 71 for placing thereon and heating a wafer W having a resist coating film formed on the surface, a support 72 which surrounds the periphery and the lower side of the hot plate 71, a lid 73 which covers the top opening, a lifting mechanism 73*a* for opening/closing the lid 73, and lifting pins 76*a* that move up and down by means of a lifting drive mechanism 76 disposed below the hot plate 71.

A heater 75, which is configured to heat the hot plate 71 to a predetermined temperature under control of the output by a temperature controller 74, is embedded in the hot plate 71. To the hot plate 71 is attached a temperature sensor 30*a* as a temperature detection means for detecting the temperature of the hot plate 71. A detection signal of the temperature of the hot plate 71, detected by the temperature sensor 30*a*, is transmitted to the temperature controller 74 and to the abnormality determination system 20.

A change in the temperature of the hot plate 71 upon heat treatment of a wafer W will now be described by using the time-series data 41 of the heat treatment device 70, shown by the solid line in FIG. 10. Before a wafer W is carried into the heat treatment device 70, the hot plate 71 is controlled by the temperature controller 74 to keep a predetermined temperature, e.g. 100° C. On the other hand, the wafer W has, for example, the internal temperature, e.g. about 23° C., of a clean room in which the resist coating/developing apparatus is installed. When the wafer W is carried into the heat treatment device 70 and placed on the hot plate 71, the wafer W absorbs heat from the hot plate 71, whereby the temperature of the hot plate 71 drops and the temperature of the wafer W rises. On the other hand, the temperature controller 74 is switched to heating control; power is supplied to the heater 75 so as to heat the hot plate 71. Accordingly, the temperature of the hot plate 71 stops dropping and begins to rise, and overshoots a target temperature, e.g. 100° C. The power supply to the heater 75 is then set to zero, whereby the temperature of the hot plate 71 begins to drop. The temperature of the hot plate 71 is controlled such that after a predetermined period of time has elapsed from the time when the wafer W was placed on the hot plate 71, the detection value of the temperature sensor 30*a* keeps a predetermined temperature, e.g. 100° C.

Figure 10:
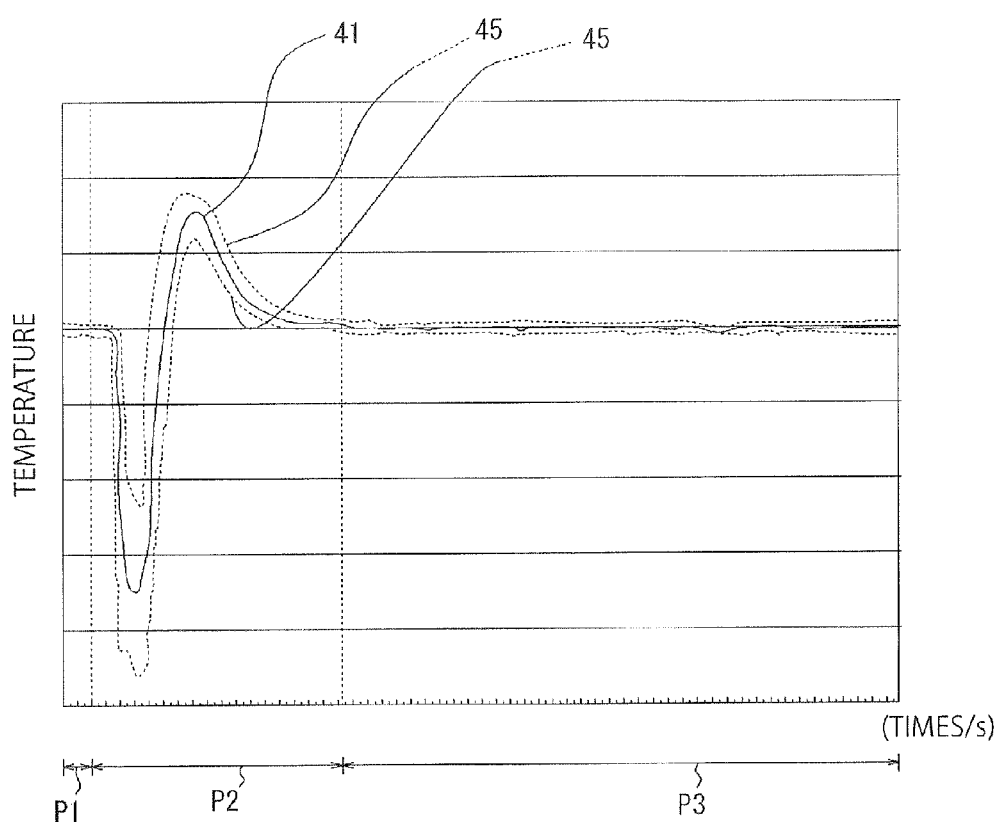
FIG. 10 is a graph illustrating comparison of upper and lower variable threshold value data with time-series data in the heating unit.

The dotted lines in FIG. 10 represent upper and lower variable threshold value data 45. The upper and lower variable threshold value data 45 shown in FIG. 10 is calculated from time-series data 41 on 4 lots of, for example 100, wafers W. The coefficients k and the correction value H may be set for each of the chronological intervals P1, P2, P3.

A description will now be given of application of the above-described abnormality determination system 20 to a processing liquid supply section 50 which is one of the processing sections constituting the resist coating/developing apparatus. The processing liquid supply section 50, for example, applies a resist solution to a wafer W which has undergone antireflective film-forming processing and cooling processing.

Figure 11:
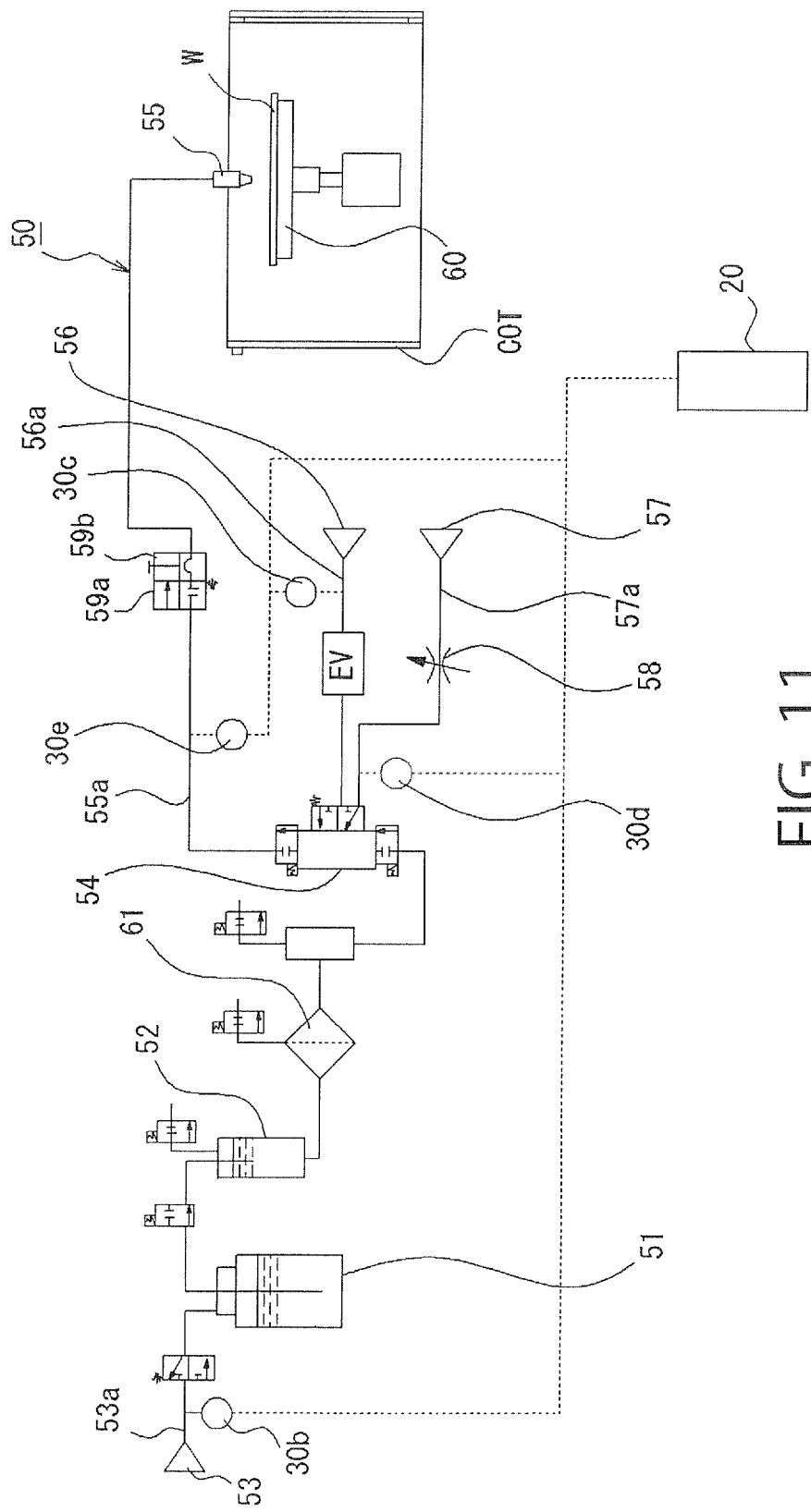
FIG. 11 is a schematic cross-sectional view showing the construction of a processing liquid supply section, constituting the resist coating/developing apparatus, and the abnormality determination system.

As shown in FIG. 11, the processing liquid supply section 50 mainly comprises: a resist container 51 for storing a resist solution, disposed in the storage 14 of the liquid processing unit U4; a pressure source 53 for pressuring the resist container 51 through a pressurizing line 53*a* to pressure-feed the resist solution toward a reservoir tank 52; a diaphragm pump 54 for drawing the resist solution from the reservoir tank 52 and passing the resist solution through a filter 61, and supplying the resist solution to a nozzle 55 through a processing liquid supply line 55*a*; a pressure source 56 for pressurizing the diaphragm pump 54 through a pressurizing line 56*a*; a suction source 57 for depressurizing the diaphragm pump 54 through a depressurizing line 57*a*; an on-off valve 59*a* and a suck-back valve 59*b*, both interposed in the processing liquid supply line 55*a*; an electropneumatic regulator EV, interposed in the pressurizing line 56*a*, for regulating the pressure in the pump 54; a variable orifice 58, interposed in the depressurizing line 57*a*, for controlling the flow of a gas; and spin chucks 60, disposed in a coating unit COT, for holding a wafer W in a horizontal position when the resist solution is ejected from the nozzle 55 toward the wafer W.

The pressurizing line 53*a* is provided with a pressure sensor 30*b* between the pressure source 53 and the resist container 51, the pressurizing line 56*a* is provided with a pressure sensor 30*c* between the pressure source 56 and the electropneumatic regulator EV, and the depressurizing line 57*a* is provided with a pressure sensor 30*d* between the diaphragm pump 54 and the variable orifice 58. The processing liquid supply line 55*a* is provided with a flow rate sensor 30*e* between the diaphragm pump 54 and the on-off valve 59*a*. Detection signals of the pressures or the flow rate detected by the sensors 30*b*, 30*c*, 30*d*, and 30*e* are transmitted to the abnormality determination system 20. Thus, the processing liquid supply section 50 monitors the occurrence of an abnormality by means of the four sensors 30*b*, 30*c*, 30*d*, and 30*e*.

Figure 12:
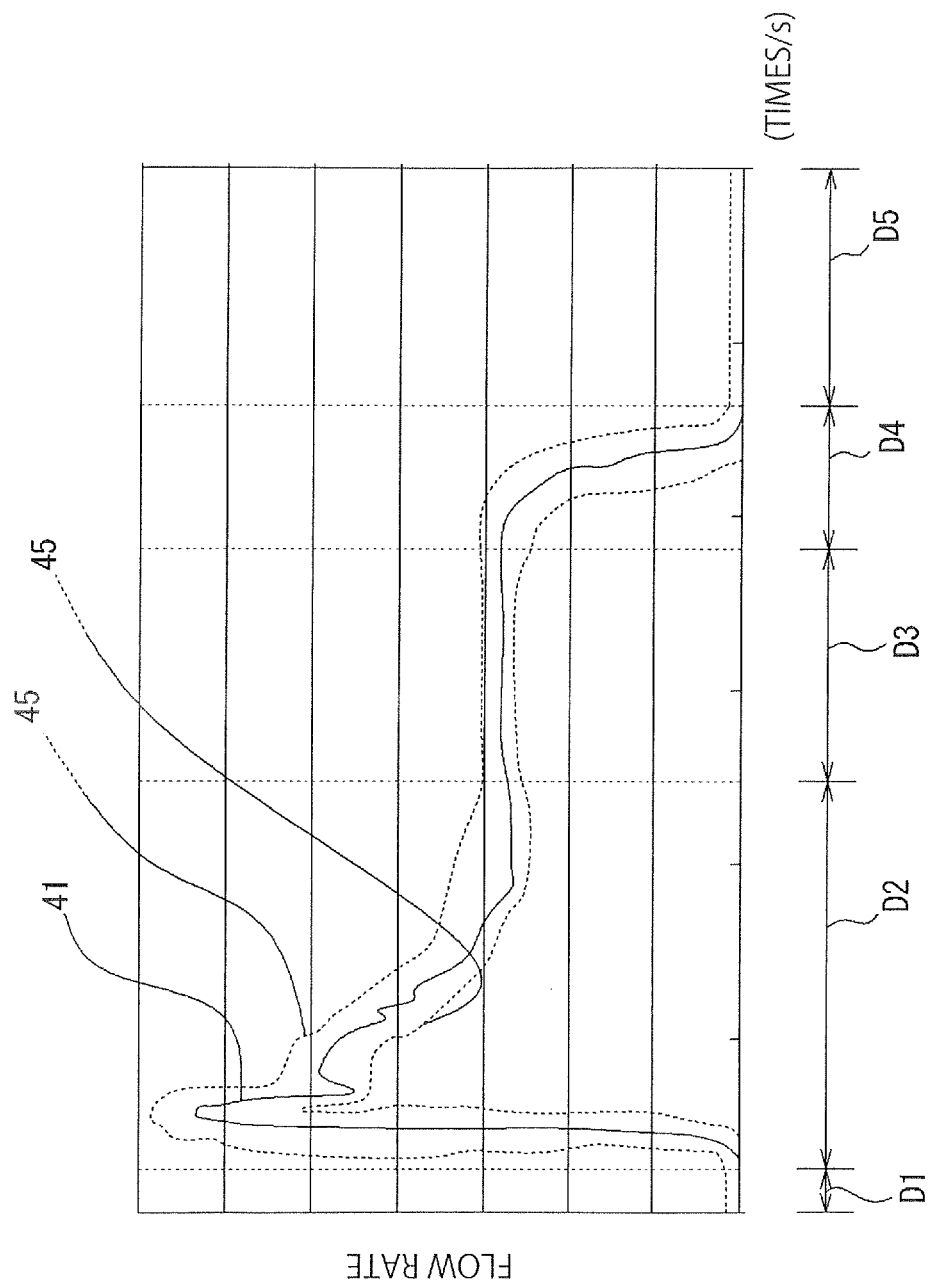
FIG. 12 is a graph illustrating comparison of upper and lower variable threshold value data with time-series data in the processing liquid supply unit.

FIG. 12 is a graph showing upper and lower variable threshold value data 45 as calculated by using time-series data 41 acquired from the flow rate sensor 30*e*, provided in the processing liquid supply line 55*a*, of the four sensors 30*b*, 30*c*, 30*d*, and 30*e*. In FIG. 12, the dotted lines represent the upper and lower variable threshold value data 45, and the solid line represents the time-series data 41 of the processing liquid supply section 50. The upper and lower variable threshold value data 45 shown in FIG. 12 is calculated from time-series data 41 on 4 lots of for example 100, wafers W. The coefficients k and the correction value H may be set for each of the chronological intervals D1, D2, D3, D4, and D5.

While the present invention has been described with reference to the cases where the abnormality determination system 20 is applied to the heat treatment device 70 and the processing liquid supply section 50 which are processing sections constituting the resist coating/developing apparatus, the abnormality determination system 20 can determine the occurrence of an abnormality in other processing sections or mechanisms. For example, the present invention can also be applied to a transport mechanism for transporting a wafer W to processing sections.

As shown in FIG. 2, the transport mechanism A4, provided in the center of the transport chamber 15, is movable in the X-axis, Y-axis and vertical (Z-axis) directions and is capable of rotating an arm on a vertical axis. The transport mechanism A4 is configured to be capable of approaching a transfer unit (TRS) 17, a high-precision temperature control unit (not shown), a peripheral exposure unit 19, a buffer cassette (not shown), and the shelf unit U3 of the processing block 2 in order to transfer/receive a wafer W to/from each of these units.

The transport mechanism A4 is provided with sensors including a position sensor (not shown) for detecting the positions in the X-axis, Y-axis and Z-axis directions, a position sensor (not shown) for detecting the angle θ of rotation of the arm, a speed sensor (not shown) for detecting the speed of the transport mechanism A4, and a torque sensor (not shown) for detecting the torque that moves the transport mechanism A4. Detection signals of the position, speed and torque detected by the sensors are transmitted to the abnormality determination system 20 and can be acquired as time-series data 41 that changes with time. Upper and lower variable threshold value data 45 can be calculated from the time-series data 41, and the data 45 obtained can be used to determine the occurrence of an abnormality.

While the present invention has been described with reference to preferred embodiments, it is understood that the present invention is not limited to the embodiments described above, but is capable of various changes and modifications. For example, though the above-described inspection device 37 is incorporated in the coating/developing apparatus, it is possible to inspect a wafer W with an inspection device independent of the coating/developing apparatus. In the above-described embodiments, the selection of model data 43 by the data selecting section 23 is made based on the results of evaluation by the inspection device 37 on actual wafers W which have undergone processing in the coating/developing apparatus. However, it is also possible to subject test wafers to processing in the coating/developing apparatus, and to select, as model data 43, the time-series data 41 of only those test wafers which are evaluated to have been normally processed. Further, it is also possible to calculate upper and lower variable threshold value data 45 based on model data 43 acquired in another coating/developing apparatus.

Though in the above-described embodiments the abnormality determination system according to the present invention is applied to sensors, such as a temperature sensor and a pressure sensor, which are provided in the coating/developing apparatus, the abnormality determination system can also be applied to other types of sensors such as a power sensor, an electromagnetic wave sensor, a vibration sensor, etc.

Though in the above-described embodiments the abnormality determination system according to the present invention is applied to the coating/developing apparatus for a semiconductor wafer, the abnormality determination system can also be applied to a coating/developing apparatus for a processing object other than a semiconductor wafer, for example, an FDP substrate. The abnormality determination system according to the present invention can be applied not only to a coating/developing apparatus which performs a plurality of process steps but also to a processing apparatus which performs a single process step.

The invention claimed is:

1. An abnormality determination system for a processing apparatus, comprising:
   a data acquiring section configured to acquire time-series data indicating change of a parameter value with time during processing of a processing object, wherein the data acquiring section is configured to obtain the parameter value from a signal outputted by a sensor installed in a processing apparatus for processing the processing object and is inputted to the data acquiring section, and wherein the parameter value indicates a processing condition for processing the processing object during the processing of the processing object;
   a data selecting section configured to select only model data, which is time-series data associated with the processing objections having been processed normally, from the time-series data having been acquired by the data acquiring section;
   a threshold value setting section configured to calculate variable threshold value data defining the change of an allowable range of the parameter value with time during processing of a processing object, based on the model data selected by the data selecting section; and
   a determining section configured to determine an occurrence of an abnormality of the processing condition of another processing object, which is processed after calculation of the variable threshold value data, by comparing time-series data, which is associated with said another processing object and is acquired by the data acquiring section, with the variable threshold value data.

2. The abnormality determination system for a processing apparatus according to claim 1, wherein the data acquiring section is configured to acquire time-series data for each unit of processing performed by the processing apparatus.

3. The abnormality determination system for a processing apparatus according to claim 2, wherein the threshold value setting section s configured to calculate variable threshold value data at least in a certain chronological interval in the unit of processing.

4. The abnormality determination system for a processing apparatus according to claim 1, wherein the processing object is subjected to a plurality of process steps in a plurality of processing sections constituting the processing apparatus, and the data acquiring section is configured to acquire time-series data for each unit of processing performed by each of the processing sections from a signal outputted from a sensor installed in the processing section.

5. The abnormality determination system for a processing apparatus according to claim 1, wherein the data selecting section is configured to select a plurality of model data; the abnormality determination system further comprises an average data calculating section configured to calculate average data from the model data; and the threshold value setting section is configured to calculate the variable threshold value data from the average data.

6. The abnormality determination system for a processing apparatus according to claim 1, wherein the threshold value setting section is configured to calculate upper and lower variable threshold value data.

7. The abnormality determination system for a processing apparatus according to claim 6, wherein the upper threshold value of the variable threshold value data is calculated by adding a value, obtained by multiplying a standard deviation of model data values at a chronological point by a coefficient, to an average data value at the chronological point, while the lower threshold value of the variable threshold value data is calculated by subtracting the value, obtained by multiplying the standard deviation by the coefficient, from the average data value.

8. The abnormality determination system for a processing apparatus according to claim 6, wherein the upper threshold value of the variable threshold value data is calculated by adding a value, obtained by multiplying the standard deviation of model data values at a chronological point by a coefficient, to an average data value at the chronological point, and further adding, to a result of addition, a value obtained by multiplying the average data value by a correction value, while the lower threshold value of the variable threshold value data is calculated by subtracting the value, obtained by multiplying the standard deviation by the coefficient, from the average data value, and further subtracting, from a result of subtraction, the value obtained by multiplying the average data value by the correction value.

9. The abnormality determination system for a processing apparatus according to claim 1, wherein the threshold value setting section is configured to allow change of an acceptable range of the variable threshold value data at least in a certain chronological interval.

10. The abnormality determination system for a processing apparatus according to claim 1, wherein the data selecting section is configured to select, after processing of processing objects by means of the processing apparatus, the model data based on an evaluation performed by an inspection device which is configured to evaluate a processing result of the processing object performed by the processing apparatus.

11. An abnormality determination method for a processing apparatus, performed by E computer, comprising:
   a first data acquiring step that acquires time-series data indicating change of a parameter value with the time during processing of a processing object, rein the parameter value is obtained from a signal outputted by a sensor installed in a processing apparatus for processing the processing object, and wherein the parameter value indicates a processing condition for processing the processing object during the processing of the processing object;

a data selecting step that selects only model data, which is time-series data associated with processing objects having been processed normally, from the time-series data having been acquired in the first data acquiring step;

a threshold value setting step that calculates variable threshold value data defining the change of an allowable range of the parameter value with time during processing of a processing object, based on the model data selected in the data selecting step;

a second data acquiring step that acquires time-series data indicating the change of the parameter value with time during processing of another processing object which is processed after calculation of the variable threshold value data; and a determining step that determines an occurrence of an abnormality of the processing condition of said another processing object by comparing time-series data, which is acquired in the second data acquiring step, with the variable threshold value data.

12. The abnormality determination method for a processing apparatus according to claim 11, wherein each of the first and second data acquiring steps aquire time-series data for each unit of processing performed by the processing apparatus.

13. The abnormality determination method for a processing apparatus according to claim 12, wherein the processing object is subjected to a plurality of process steps in a plurality of processing sections constituting the processing apparatus, and each of the first and second data acquiring steps aquire time-series data for each unit of processing performed by each of the processing sections from a signal outputted from a sensor installed in the processing section.

14. The abnormality determination method for a processing apparatus according to claim 12, wherein the threshold value setting step calculates variable threshold value data at least in a certain chronological interval in the unit of processing.

15. The abnormality determination method for a processing apparatus according to claim 11, wherein the data selecting step selects a plurality of model data; the abnormality determination method further comprises an average data calculation step that calculates average data from the plurality of model data; and the threshold value setting step calculates the variable threshold value data from the average data.

16. The abnormality determination method for a processing apparatus according to claim 11, wherein the threshold value setting step calculates upper and lower variable threshold value data.

17. The abnormality determination method for a processing apparatus according to claim 16, wherein the upper threshold value of the variable threshold value data is calculated by adding a value, obtained by multiplying a standard deviation of model data values at a chronological point by a coefficient, to an average data value at the chronological point, while the lower threshold value of the variable threshold value data is calculated by subtracting the value, obtained by multiplying the standard deviation by the coefficient, from the average data value.

18. The abnormality determination method for a processing apparatus according to claim 16, wherein the upper threshold value of the variable threshold value data is calculated by adding a value, obtained by multiplying the standard deviation of model data values at a chronological point by a coefficient, to an average data value at the chronological point, and further adding, to a result of addition, a value obtained by multiplying the average data value by a correction value, while the lower threshold value of the variable threshold value data is calculated by subtracting the value, obtained by multiplying the standard deviation by the coefficient, from the average data value, and further subtracting, from a result of subtraction, the value obtained by multiplying the average data value by the correction value.

19. The abnormality determination method for a processing apparatus according to claim 11, wherein the threshold value setting step allows change of an acceptable range of the variable threshold value data at least in a certain chronological interval.

20. The abnormality determination method for a processing apparatus according to claim 11, wherein the data selecting step selects, after processing of processing objects by means of the processing apparatus, the model data based on an evaluation performed by an inspection device which is configured to evaluate a processing result of the processing object performed by the processing apparatus.

* * * * *